METAL BALL CONNECTION TO CRYSTALS

Filed June 7, 1962

INVENTOR.
FRANK J. SAIA,
CECIL L. DE MILLE,
JOHN G. QUETSCH, JR.,
BY
Charles S. Haughey
ATTORNEY.

3,266,137

METAL BALL CONNECTION TO CRYSTALS

Cecil L. De Mille, Santa Ana, John G. Quetsch, Jr., Anaheim, and Frank J. Saia, Costa Mesa, Calif., assignors to Hughes Aircraft Company, Culver City, Calif., a corporation of Delaware Filed June 7, 1962, Ser. No. 200,813
3 Claims. (Cl. 29—473.1)

This invention relates to crystal contacts, and is of particular importance in making connections to very small areas of diffused junction semiconductor devices.

In the fabrication of semiconductor devices it is often necessary or desirable to make electrical connections to very small areas of the crystals without deep penetration of the crystal in the bonding process, and it is highly desirable to do so in a manner which does not require great precision or skill, yet allows considerable automatic handling.

To meet the foregoing requirements and to provide an electrode lead of substantial mass to which an electrode may then be easily attached without deleterious effect upon the crystal bond, an electrically insulating mask is formed on a surface of the crystal, and an aperture is formed therein, as by a buffered acid etching technique, exposing a portion of the crystal surface where it is desired to attach an electrode lead. At this point junction-forming impurities may be diffused through the aperture. A film of gold is then deposited in the aperture, and the crystal is then heated to alloy the gold to the crystal. A "ball" of silver, aluminum, or having a silver or aluminum surface coating, is then placed in contact with the gold alloy in the aperture, and the assembly heated to bond the ball to the crystal with a gold alloy. The increasing melting point of gold-silver, or gold aluminum alloy with increasing silver or aluminum content provides a self-limiting mechanism to limit penetration of the gold-crystal alloy while bonding a relatively large mass electrode lead thereto, and the relatively thin gold film, by its small mass, prevents substantial alloy penetration of the crystal by the gold alloy. A strong bond to the crystal is thus produced in a limited area, with minimum penetration and in an easily controlled procedure subject to mechanization.

For further consideration of what is believed to be novel and inventive, attention is directed to the following specification and appended claims and the drawings in which:

Figure 1:
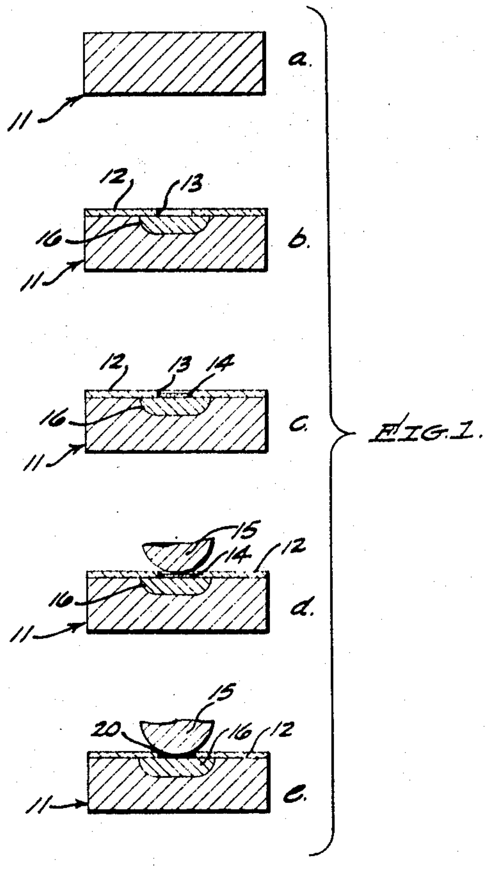
FIG. 1 shows a stepwise process for making an electrode lead contact to a crystal according to this invention.

A crystal slice or die 11 in FIG. 1*a* is coated with an apertured electrically insulating mask 12 as shown in FIG. 1*b*, and an impurity is diffused through the window to form P-region 16; a layer 14 of gold, or alternatively of gold and tin, is deposited on the crystal in the aperture 13 as shown in FIG. 1*c*.

The crystal is then preferably heated to about 400° C. to 500° C. to alloy the gold (or gold-tin) into the crystal. A ball or chunk 15 of silver is then placed in contact with the layer 14 as shown in FIG. 1*d*, and the assembly is heated, preferably with vibration, sufficiently to form a silver-gold alloy bond, as shown in FIG. 1*e*. The layer of gold used in the layer 14 is small enough to prevent substantial penetration of the crystal 11 by the gold. The gold silver alloy dissolves increasing volumes of silver only with increasing temperatures, hence penetration of the crystal in the silver ball bonding step substantially does not occur beyond that already obtained by the gold.

When tin is used, the initial alloying step should occur above about 232° C., the M.P. of tin. When gold is used without tin, a temperature of at least 370° C. is required to alloy gold into silicon crystals, and at least 356° C. to alloy gold into germanium.

The very high solubility in gold of silicon or germanium makes necessary use of very thin gold layers to prevent deep penetrations. Bonding of silver to gold, however, dissolves very small proportions of silver before the gold alloy is saturated with silver, such as about 6% Ag, and the remaining silver retains its shape for subsequent operations.

The assembly produced as described above may next be encapsulated into standard or special packages by making a suitable back contact to the broad face of the crystal opposite to the silver ball electrode contact, and a second connection may be made to the silver ball 15. The ball holds its shape and is easily connected to, and the ball in turn securely connects to the very small crystal area exposed through the aperture 13 of the insulating mask 12. The ball 15 may be of silver, aluminum, or of a base metal such as tantalum or molybdenum, with a silver or aluminum coating.

Figure 2:
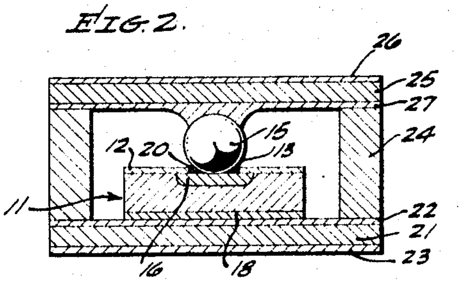
FIG. 2 shows a completed device, produced by the process illustrated in FIG. 1.
Figure 3:
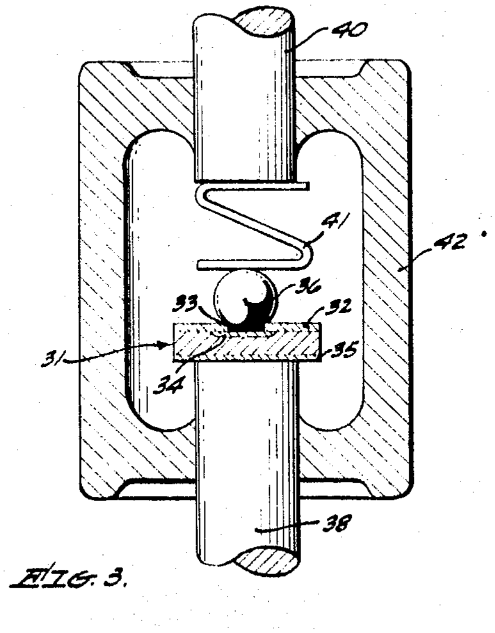
FIG. 3 shows a completed device utilizing the process illustrated in FIG. 1.

To illustrate the invention examples are given, illustrated by FIGS. 2 and 3, of devices made according to this invention and encapsulated in a glass type package, and in a leadless wafer package particularly useful in microminiature circuitry.

*Example 1*

The structure illustrated in FIG. 2 is produced by the following procedure. A silicon N-type electrical conductivity semiconductor crystal slice is subjected to an oxidizing atmosphere to grow a silicon-oxide mask film 12 on one face of the crystal, and then by photo-resist and etching techniques aperture 13 are etched through the mask to expose the crystal face. A P-type impurity such as boron is diffused into the crystal through the aperture, or window, of the mask to form P-type region 16, and subsequently an N-type impurity such as phosphorus is diffused into the reverse side of the crystal to produce an N+ region 18.

A layer of gold of about .0005″ is next electroplated into the window, or aperture, of the mask, and a layer of tin of about .0001″ is then electroplated on to the gold layer. The assembly is then heated to about 250° to 400° C. to alloy the gold-tin to the crystal and make a strong physical and electrical contact thereto. A ball of silver of about .007″ diameter is next placed in contact with the alloy in the aperture and heated to 400° to 500° C. to bond the silver thereto. A small vibration of the assembly during heating of .001″ amplitude at 60 cps. may be used to assist in initial wetting, hence to obtain more reliable bonding, of the silver ball to the crystal.

After cooling, as shown in FIG. 2, the crystal is next assembled onto a bottom electrode plate 21 of Kovar brand metal, which is a magnetic, iron-nickel-cobalt alloy, the adjacent surface of which is coated with gold-tin alloy 22, and the other side of which is coated with gold 23. A ring 24 of ceramic, preferably dense alumina having metallized ends, is placed on the Kovar electrode around the crystal, and a second, or top, electrode plate 25 of nonmagnetic material such as molybdenum, coated on each side with gold-tin alloy layers 26 and 27. The silver ball should contact the gold-tin alloy of the top electrode plate. The assembly is then heated to about 300° C. to simultaneously bond the ring and the crystal to the respective electrode plates, leaving the exposed surface of the bottom plate gold in color, and the top surface, the gold-tin alloy, metallic white in color.

The structure of FIG. 2 results from the above procedures, wtih the crystal 11 bonded through alloy 20 of silicon-gold-tin-silver to the silver ball 15 adjacent P-type region 16 of the crystal in the area defined by the mask 12. The bottom face of the crystal is bonded through a gold-tin-silicon alloy to the bottom plate 21, and the ceramic ring 24 bonded between the plates 21 and 25 forms a hermetic seal for the crystal. The silver ball 15 makes a strong, reliable contact between the top plate and the crystal, and it holds its shape during the encapsulation step.

*Example 2*

The structure illustrated in FIG. 3 is produced as follows: a P-type germanium crystal 31 is prepared by forming an insulating silicon oxide mask 32 having apertures therein by any suitable process, such as silane decomposition to deposit the mask, followed by photo-resist and etching techniques to produce apertures 33 or windows in the mask. An N-type impurity such as phosphorous is diffused through the window, or aperture 33 to form an N-type region 34 thereadjacent; and a P-type impurity, such as boron, is diffused into the other face of the crystal to produce a P+ region 35 to which ohmic contact may be made. Gold is next electrodeposited in the aperture 33, and a silver, or silver coated ball 36 is placed thereon and upon heating to about 400° C. is bonded thereto. The P+ region of the die is then mounted on and bonded to the pedestal wire 38, and a second lead wire 40 having a whisker 41 thereon, together with a glass bead, is sealed to a glass cylindrical section on the wire 38 to form a glass envelope 42. The whisker 41, which may be tin plated nickel, or silver ribbon, contacts the silver ball 36, and is preferably alloy bonded thereto.

The method of bonding a metal ball to a crystal region defined by an aperture in an insulating mask to form an electrode connection to subsequently attached electrodes thus makes possible simplified encapsulation and assembly procedures and thus results in improved semiconductor devices. While this invention has been illustrated in connection with diodes, the techniques may of course be applied to manufacture of transistors and other semiconductor or crystal devices.

What is claimed is:

1. A method of providing an electrode connection to a region of a silicon crystal which comprises:

forming an electrically insulating mask on a surface of the crystal, with an aperture in the mask;

depositing a layer of gold on the crystal in the aperture;

depositing a layer of tin upon a layer of gold;

heating the crystal to at least 232° C. to alloy said layers to said crystal, forming an alloy of gold, tin and silicon;

contacting the alloy in said aperture with an electrode of silver;

and heating the assembly to alloy bond the silver electrode to the crystal through said aperture.

2. A method of providing an electrode connection to a region of a germanium crystal which comprises:

forming an electrically insulating mask on a surface of the crystal, with an aperture in the mask;

depositing a layer of gold on the crystal in the aperture;

depositing a layer of tin upon a layer of gold;

heating the crystal to at least 232° C. to alloy said layers to said crystal, forming an alloy of gold, tin and silicon;

contacting the alloy in said aperture with an electrode of silver;

and heating the assembly to alloy bond the silver electrode to the crystal through said aperture.

3. A method of providing an electrode connection to a region of a silicon crystal which comprises:

forming a silicon oxide mask by oxidizing the surface of the crystal, with an aperture in the mask;

depositing a layer of gold on the crystal in the aperture;

depositing a layer of tin upon a layer of gold;

heating the crystal to at least 232° C. to alloy said layers to said crystal, forming an alloy of gold, tin and silicon;

contacting the alloy in said aperture with an electrode of silver;

and heating the assembly to alloy bond the silver electrode to the crystal through said aperture.

References Cited by the Examiner

UNITED STATES PATENTS

| | | | |
|---|---|---|---|
| 2,381,025 | 8/1945 | Addink | 29—25.3 |
| 2,842,831 | 7/1958 | Pfann | 317—235 |
| 2,874,076 | 2/1959 | Schwartz | 317—240 |
| 2,944,321 | 7/1960 | Westberg | 29—25.3 |
| 2,947,922 | 8/1960 | Junker | 317—234 |
| 2,987,658 | 6/1961 | Messenger | 317—234 |
| 3,025,589 | 3/1962 | Hoerni | 317—235 |
| 3,028,663 | 4/1962 | Iwersen et al. | 317—240 |
| 3,030,557 | 4/1962 | Dermit | 317—234 |
| 3,064,341 | 11/1962 | Masterson | 317—234 |
| 3,068,383 | 12/1962 | Herlet et al. | 317—234 |
| 3,080,640 | 3/1963 | Jochems | 29—155.5 |
| 3,109,225 | 11/1963 | Wright | 29—155.5 |
| 3,141,226 | 7/1964 | Bender et al. | 317—234 |

FOREIGN PATENTS 863,010 3/1961 Great Britain.

DAVID J. GALVIN, *Primary Examiner.*